(12) United States Patent
Lee et al.

(10) Patent No.: US 7,061,344 B2
(45) Date of Patent: Jun. 13, 2006

(54) EQUIVALENT CIRCUITS AND SIMULATION METHOD FOR AN RF SWITCH

(75) Inventors: Yue-Shiun Lee, Taipei (TW); Cheng-Hsiung Chen, Taipei (TW)

(73) Assignee: United Microelectronics Corp., Hsin-Chu (TW)

( * ) Notice: Subject to any disclaimer, the term of this patent is extended or adjusted under 35 U.S.C. 154(b) by 9 days.

(21) Appl. No.: 10/711,261

(22) Filed: Sep. 6, 2004

(65) Prior Publication Data

US 2006/0049892 A1    Mar. 9, 2006

(51) Int. Cl.
*H01P 1/10* (2006.01)
*G06F 17/50* (2006.01)

(52) U.S. Cl. .................. 333/103; 333/101; 703/14
(58) Field of Classification Search ............. 333/101, 333/103; 257/107, 120, 204; 703/14
See application file for complete search history.

(56) References Cited

OTHER PUBLICATIONS

Gneiting, Thomas, Advanced Modeling Solution, Apr. 2001, Agilent EEs of EDA Seminar.*
Cheng, Yuhua et al., High-Frequency Small Signal AC and Noise Modeling of MOSFETs for RF IC Design, Mar. 2002, IEEE, vol. 49 No. 3.*
Jang, Jaejune, Small-Signal Modeling of RF CMOS, Aug. 2004, Stanford University.*

* cited by examiner

*Primary Examiner*—Dean Takaoka
(74) *Attorney, Agent, or Firm*—Winston Hsu

(57) ABSTRACT

Equivalent circuits and a simulation method for simulating an RF switch are disclosed. The equivalent circuits are a first equivalent circuit and a second equivalent circuit, and are formed by resistors, capacitors, and inductors. The method includes using the first equivalent circuit to simulate the switch at a turned-off state and using the second equivalent circuit to simulate the switch at a turned-on state.

5 Claims, 2 Drawing Sheets

EQUIVALENT CIRCUITS AND SIMULATION METHOD FOR AN RF SWITCH

BACKGROUND OF INVENTION

1. Field of the Invention

The present invention relates to an equivalent circuit and a method thereof for simulating a switch, and more particularly, to equivalent circuit and a method thereof for simulating an RF switch.

2. Description of the Prior Art

Due to the rapid development of wireless communication systems, wireless devices offering great convenience are widely used in daily communications. With wireless devices, people are able to exchange information, share experiences, and communicate with each other anytime and anywhere. Because of the wide usage of wireless devices, more various and new wireless products are developed. To shorten the flow path of a new wireless product, before the production of the new wireless product, the manufacturer usually uses circuit simulation software to analyze the electrical characteristics of the new wireless product, and then estimates and improves the quality of the circuit of the new wireless product according to the result of the simulation.

Usually a wireless device has two abilities: receiving radio signals and transmitting radio signals. To avoid wasting electric energy, when transmitting radio signals, an RF switch is used to control operations of outputting the radio signals. However, as the operating frequency of wireless devices increases and the size of RF elements reduces, the prior art circuit simulation software cannot be used to simulate an RF switch correctly.

SUMMARY OF INVENTION

It is therefore a primary object of the claimed invention to provide an equivalent circuit and a method thereof for simulating an RF switch.

According to the claimed invention, an equivalent circuit and a method thereof are disclosed to simulate a switch to output a radio signal. The method includes establishing a first equivalent circuit, establishing a second equivalent circuit, utilizing the first equivalent circuit to simulate the switch at a turned-off state, and utilizing the second equivalent circuit to simulate the switch at a turned-on state. The second equivalent circuit includes the first equivalent circuit, and both the first equivalent circuit and the second equivalent circuit are composed of resistors, capacitors, and inductors.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
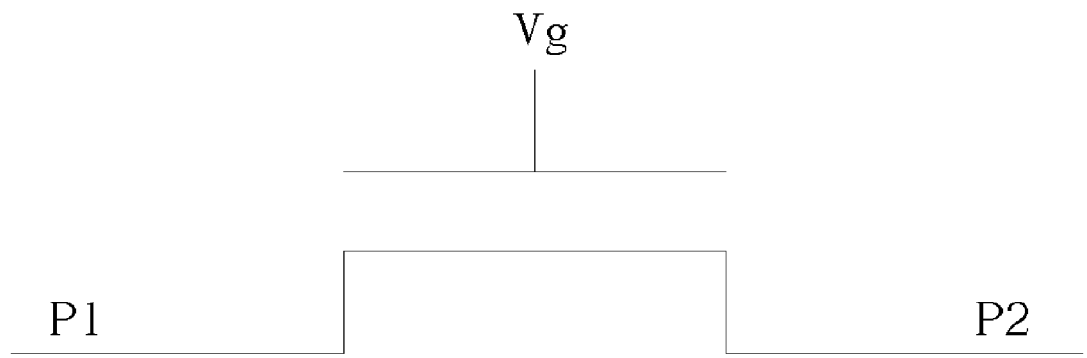
FIG. 1 is a schematic diagram of an RF switch.

Please refer to FIG. 1, which is a schematic diagram of an RF switch. The RF switch is an N-type metal-oxide semiconductor (NMOS) transistor, having a drain taken as an input port P1 for inputting an RF signal, a gate for turning the NMOS transistor on/off, and a source taken as an output port P2 for outputting the RF signal. When the NMOS transistor is turned on, the output port P2 outputs the RF signal received from the input port P1. When the NMOS transistor is turned off, the RF signal is obstructed from being outputted from the output port P2.

Figure 2:
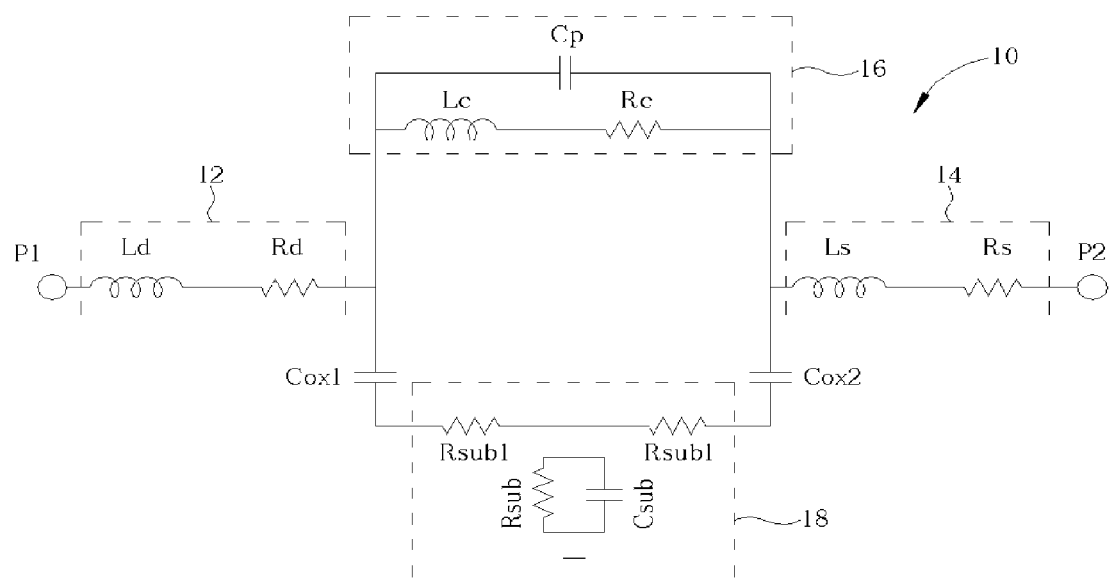
FIG. 2 is a circuit diagram of a first equivalent circuit of the RF switch shown in FIG. 1.

Please refer to FIG. 2, which is a circuit diagram of a first equivalent circuit 10 of the RF switch shown in FIG. 1. The first equivalent circuit 10 is used to simulate the RF switch at a turned-off state. The first equivalent circuit 10 comprises a first block 12, a second block 14, a third block 16, a first gate-substrate capacitor Cox1, a second gate-substrate capacitor Cox2, and a fourth block 19. The first block 12 is connected to the input port P1, and is used to simulate the effects of the metal line connected to the drain. The first block 12 has a first intrinsic resistor Rd and a first intrinsic inductor Ld connected to the first intrinsic resistor Rd in series. The second block 14 is connected to the output port P2, and is used to simulate the effects of the metal line connected to the source. The second block 14 has a second intrinsic resistor Rs and a second intrinsic inductor Ls connected to the second intrinsic resistor Rs in series. The third block 16 is connected to the first block 12 and the second block 14, and is used to simulate the poly gate of the NMOS transistor. The third block 16 has a gate capacitor Cp, a gate resistor Rc, and a gate inductor Lc. The gate resistor Rc is connected to the gate inductor Lc in series and then connected to the gate capacitor Cp in parallel. The first gate-substrate capacitor Cox1 and the second gate-substrate capacitor Cox2 are used to represent the capacitances between the poly gate and the substrate in the RF switch. Moreover, under high frequency operating mode, the substrate is not isolated from the inputted RF signal, i.e. the behavior of the substrate is influenced by the RF signal inputted from the input port P1. The fourth block 18 of the first equivalent circuit 10, thus, is used to simulate the phenomenon of the substrate. The fourth block 18 is connected in series with the first gate-substrate capacitor Cox1 and the second gate-substrate capacitor Cox2, and has a substrate capacitor Csub, a first substrate resistor Rsub, and two second substrate resistors Rsub1. The substrate capacitor Csub is connected to the first substrate resistor Rsub in series and then connected to the two second substrate resistors Rsub1.

Figure 3:
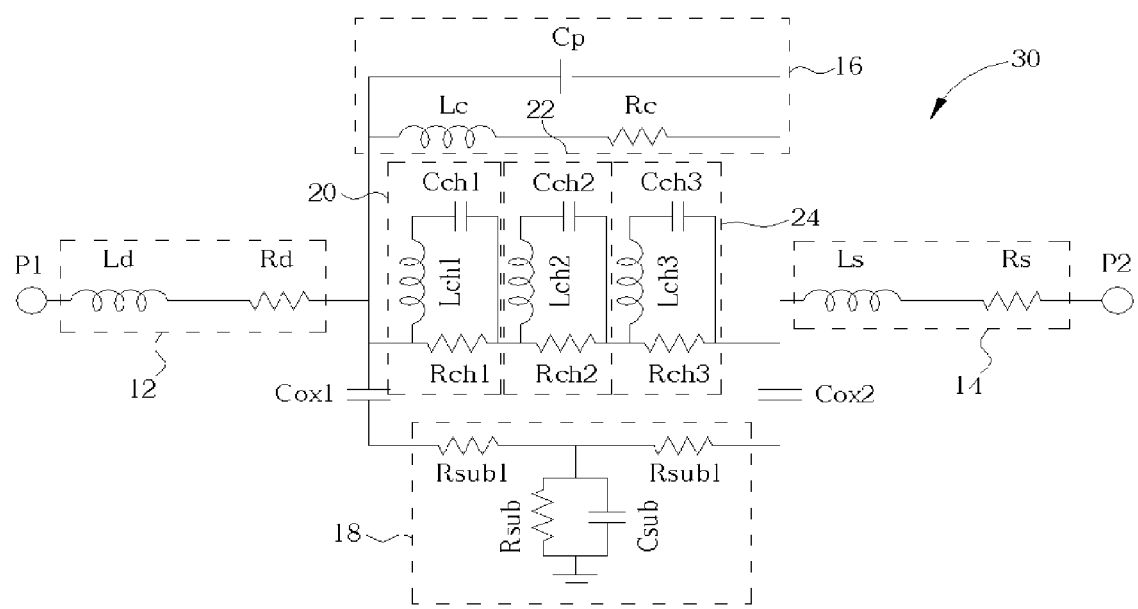
FIG. 3 is a circuit diagram of a second equivalent circuit of the RF switch shown in FIG. 1.

Please refer to FIG. 3, which is a circuit diagram of a second equivalent circuit 30 of the RF switch shown in FIG. 1. The second equivalent circuit 30 is used to simulate the RF switch at a turned-on state. The second equivalent circuit 30 includes the first equivalent circuit 10. This means that the second equivalent circuit 30 comprises the first block 12, the second block 14, the third block 16, the first gate-substrate capacitor Cox2, the second gate-substrate capacitor Cox2, and the fourth block 18. The functions of the first block 12, the second block 14, the third block 16, the first gate-substrate capacitor Cox2, the second gate-substrate capacitor Cox2, and the fourth block 18 have been described above and thus will not be repeated here. The second equivalent circuit 30 further comprises a first channel block 20, a second channel block 22, and a third channel block 23 for simulating the phenomenon of the channel of the turned-on switch. The first channel block 20, the second channel block 22, and the third channel block 24 are connected in series. The first channel block 20 is further connected to the first block 12, the third block 16, and the first gate-substrate capacitor Cox1. The first channel block 20 comprises a first channel inductor Lch1, a first channel capacitor Cch1, and a first channel resistor Rch1. The first channel inductor Lch1 is connected to the first channel capacitor Cch1 in series and then connected to the first channel resistor Rch1 in parallel. The second channel block 24 comprises a second channel inductor Lch2, a second channel capacitor Cch2, and a second channel resistor Rch2. The second channel inductor Lch2 is connected to the second channel capacitor Cch2 in series and then connected to the second channel resistor Rch2 in parallel. The third channel block 26 comprises a third channel inductor Lch3, a third channel capacitor Cch3, and a third channel resistor Rch3. The third channel inductor Lch3 is connected to the third channel capacitor Cch3 in series and then connected to the third channel resistor Rch3 in parallel.

According to actual measures of an RF switch operating within a frequency range: 100 MHz–10 GHz, and to the results of simulations by using the present equivalent circuits, the result by using a root mean square (RMS) statistic method indicates that the percentage difference between the actual physical characteristics of the RF switch and the simulated characteristics of the RF switch model of the present invention, i.e. the characteristics of the first equivalent circuit 10 and the second equivalent circuit 30, is less than 10 percent. The present RF switch model of the present invention, thus, is actually capable of being used to simulate an RF switch.

Compared with the prior art, the present invention discloses equivalent circuits and a simulation method capable of actually simulating the characteristics of an RF switch both at a turned-on state and a turned-off state. The present invention is convenient to the research and design processes for designing a new wireless product, and can shorten the flow path of the new wireless product.

Those skilled in the art will readily observe that numerous modifications and alterations of the device may be made while retaining the teachings of the present invention. Accordingly, the above disclosure should be construed as limited only by the metes and bounds of the appended claims.

What is claimed is:

1. A method for simulating a switch used to control operations of outputting a radio signal, the method comprising:

establishing a first equivalent circuit, the first equivalent circuit comprising:
an input port for inputting the radio signal;
an output port for outputting the radio signal;
a first block connected to the input port, the first block having a first intrinsic inductor and a first intrinsic resistor;
a second block connected to the output port, the second block having a second intrinsic inductor and a second intrinsic resistor;
a third block connected to the first block and the second block, the third block having a gate capacitor, a gate inductor, and a gate resistor;
a first gate-substrate capacitor connected to the first block and the third block;
a second gate-substrate capacitor connected to the second block and the third block; and
a fourth block connected to the first gate-substrate capacitor and the second gate-substrate capacitor in series, the fourth block having a substrate capacitor, a first substrate resistor, and two second substrate resistors; and utilizing the first equivalent circuit to simulate the switch at a turned-off state.

2. The method circuit of claim 1 wherein the switch is a metal-oxide semiconductor (MOS) transistor.

3. The method circuit of claim 1 further comprising:

establishing a second equivalent circuit the second equivalent circuit including the first equivalent circuit and comprising:
a first channel block connected to the first block, the third block, and the first gate-substrate capacitor, the first channel having a first channel inductor, a first channel capacitor, and a first channel resistor;
a second channel block connected to the first channel block and having a second channel inductor, a second channel capacitor, and a second channel resistor; and
a third channel block connected to the second channel block, the second block, the third block, and the second gate-substrate capacitor, the second channel block being connected in series with the first channel block and the third channel block, the third channel having a third channel inductor, a third channel capacitor, and a third channel resistor; and utilizing the second equivalent circuit to simulate the switch at a turned-on state.

4. The method of claim 3 wherein the first intrinsic resistor is connected to the first intrinsic inductor in series, the second intrinsic resistor is connected to the second intrinsic inductor in series, the gate resistor is connected to the gate inductor in series and connected to the gate capacitor in parallel, and the substrate capacitor is connected to the first substrate resistor in series and connected to the two second substrate resistors.

5. The method of claim 4 wherein the first channel inductor is connected to the first channel capacitor in series and connected to the first channel resistor in parallel, the second channel inductor is connected to the second channel capacitor in series and connected to the second channel resistor in parallel, and the third channel inductor is connected to the third channel capacitor in series and connected to the third channel resistor in parallel.

* * * * *